US006576869B1

(12) United States Patent
Gower et al.

(10) Patent No.: US 6,576,869 B1
(45) Date of Patent: Jun. 10, 2003

(54) METHOD AND APPARATUS FOR DRILLING MICROVIA HOLES IN ELECTRICAL CIRCUIT INTERCONNECTION PACKAGES

(75) Inventors: Malcolm Charles Gower, Oxford (GB); Philip Thomas Rumsby, Bladon (GB); Dafydd Wyn Thomas, Menlo Park, CA (US)

(73) Assignees: Excellon Automation Co., Torrance, CA (US); Exitech Limited, Oxford (GB)

( * ) Notice: Subject to any disclaimer, the term of this patent is extended or adjusted under 35 U.S.C. 154(b) by 0 days.

(21) Appl. No.: 09/724,046

(22) Filed: Nov. 27, 2000

Related U.S. Application Data

(63) Continuation of application No. PCT/GB99/01698, filed on May 27, 1999.

(30) Foreign Application Priority Data

May 27, 1998 (GB) ............................................... 9811328

(51) Int. Cl.[7] ................................................. B23K 26/00
(52) U.S. Cl. ................................. 219/121.71; 219/121.7
(58) Field of Search ........................ 219/121.71, 121.7, 219/121.76, 121.74, 121.75

(56) References Cited

U.S. PATENT DOCUMENTS

| | | | | | |
|---|---|---|---|---|---|
| 4,504,727 | A | * | 3/1985 | Melcher et al. | ........ 219/121 LB |
| 4,681,656 | A | * | 7/1987 | Byrum | ........................ 156/645 |
| 4,789,770 | A | * | 12/1988 | Kasner et al. | ........... 219/121.7 |
| 5,593,606 | A | * | 1/1997 | Owen et al. | ........... 219/121.71 |
| 5,841,099 | A | * | 11/1998 | Owen et al. | ........... 219/121.69 |

* cited by examiner

Primary Examiner—M. Alexandra Elve
(74) Attorney, Agent, or Firm—Lowe Hauptman Gilman & Berner, LLP (57) ABSTRACT

This invention relates to using mid-infrared high-power pulsed laser radiation sources for drilling high-quality microvia interconnection holes in printed circuit (wiring) boards and other electrical circuit packages.

52 Claims, 4 Drawing Sheets

METHOD AND APPARATUS FOR DRILLING MICROVIA HOLES IN ELECTRICAL CIRCUIT INTERCONNECTION PACKAGES

RELATED APPLICATIONS

This application is based on PCT application PCT/GB99/01698 filed on May 27, 1999 which a continuation of Great Britain Patent Application serial number 9811328.5 filed on May 27, 1998 and claims the benefits of such prior applications. Each of these applications is incorporated herein by reference.

TECHNICAL FIELD

This invention relates to a method and apparatus for drilling microvia holes in electrical circuit packages, and particularly to the use of mid-infrared pulsed laser radiation sources therein.

BACKGROUND ART

For the purposes of this invention the following definitions of spectral wavelength regions apply: ultraviolet: 190–400 nm, visible: 400 nm-700 nm, near-infrared: 700 nm–1.5 cm, mid-infrared: 1.51 $\mu$m–8 $\mu$m, far-infrared: 8–100 $\mu$m.

Figure 1:
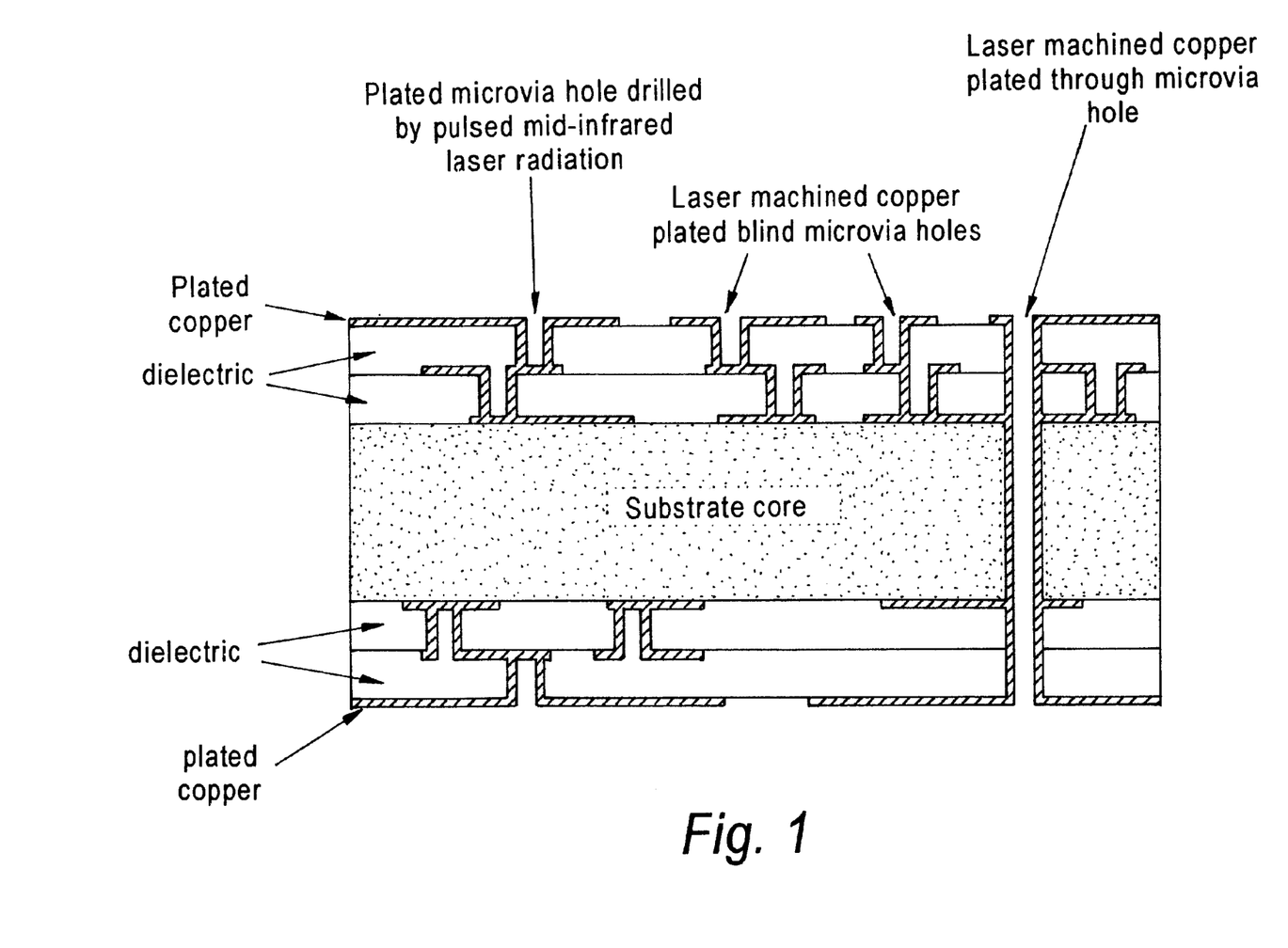
FIG. 1 schematically shows a printed circuit board having blind and through microvia holes.

Since 1981, pulsed lasers have been investigated for the purposes of drilling small interconnection (microvia) holes in circuit interconnection packages such as printed circuit boards or printed wiring boards (PCB's or PWB's), multichip modules (MCM's), ball grid arrays (BGA's), tapeautomated bonds (TAB's), etc. A schematic depicting plated and unplated, blind and through, microvia holes drilled in a 4-level board is shown in FIG. 1. Pulsed far-infrared $CO_2$ lasers between 9–11 $\mu$m wavelength are now used to drill blind via holes in the electrically insulating dielectric material of the multilayer sandwich comprising these packages. Similarly near-infrared solid-state Nd lasers at 1.06 $\mu$m wavelength are being used with some success to drill via holes in the top conductive copper layer of the package as well as the dielectric layer. Likewise frequency-tripled and quadrupled radiation at 355 nm and 266 nm from these lasers are also being used for this application. Although since 1987 ultraviolet excimer lasers at wavelengths of 248 nm and 308 nm have been used for manufacturing via holes in high-value MCM's and BGA's interconnect packages, their relatively slow drilling speeds coupled to their high capital and running costs make these lasers unsuitable for drilling vias in lower cost devices such as PCB's and PWB's.

Each pulsed laser has distinct advantages and disadvantages for drilling microvias. Due to the low powers (<4W) available, high operating costs (>$2/hr-dominated by replacement harmonic conversation crystal costs) and low ablation rates (<1 $\mu$m/pulse), the use of harmonically-generated ultraviolet radiation from 1.061 $\mu$m Nd lasers for microvia drilling tends to be a relatively slow and expensive process. On the other hand, because of the relatively high near-infrared transparency of most organic materials used as dielectric materials, pulsed laser sources in this spectral region produce poor hole quality when drilling the dielectric layer and when drilling the top copper layer, dielectric materials underneath are sometimes prone to damage. Far-infrared lasers cannot effectively drill metallic copper due to plasma screening effects experienced by longer wavelength radiation and holes drilled in the dielectric tend to be of a shape and quality which make subsequent plating processes difficult, unless extra steps, such as oxidising the metal to increase its coupling efficiency, are used.

SUMMARY OF THE INVENTION

According to a first aspect of the present invention, there is provided a method of drilling microvia holes in printed circuit boards or printed wiring boards or other electrical circuit interconnection packages using a pulsed laser radiation source emitting radiation having a wavelength or wavelengths in the mid-infrared region.

The method may comprise using a pulsed laser radiation source comprising a Holmium laser, producing radiation at 2.1 $\mu$m wavelength. The method may comprise using a pulsed laser radiation source comprising an Erbium laser, producing radiation at 2.94 $\mu$m wavelength.

The method may comprise using a pulsed laser radiation source comprising a gas Carbon Monoxide (CO) laser, producing radiation having wavelengths in the range 5–6 $\mu$m.

The method may comprise using a pulsed laser radiation source comprising a laser and an Optical Parametric Oscillator (OPO) or an Optical Parametric Amplifier (OPA), each tuneable between 1.5–4.8 $\mu$m.

These laser radiation sources are suitable for this invention and for implementing into manufacturing processes, having high reliability, infrequent servicing, low capital and operating costs.

Preferably, the method comprises using a pulsed laser radiation source capable of producing an average laser radiation power of greater than 2W, and preferably having operating costs of less than $1/ hr.

Preferably, the method comprise s drilling microvia holes at speeds exceeding 200 holes/sec. The speed of drilling will depend on the tool architecture used, the material type, thickness and hole density.

The use of mid-infrared lasers for this method solves many of the difficulties encountered when using pulsed laser sources at other wavelengths. Mid-infrared lasers provide laser radiation sources capable of drilling high quality microvia holes at high drilling speeds with relatively low operating costs and high reliability.

Issues associated with laser drilling microvias in a multilayer sandwich of materials such as encountered in PCB's can be broken down into several subproblems. This invention relates to solving each of these by appropriate use of one or more suitably chosen pulsed laser radiation sources emitting radiation in the mid-infrared spectral region.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 2:
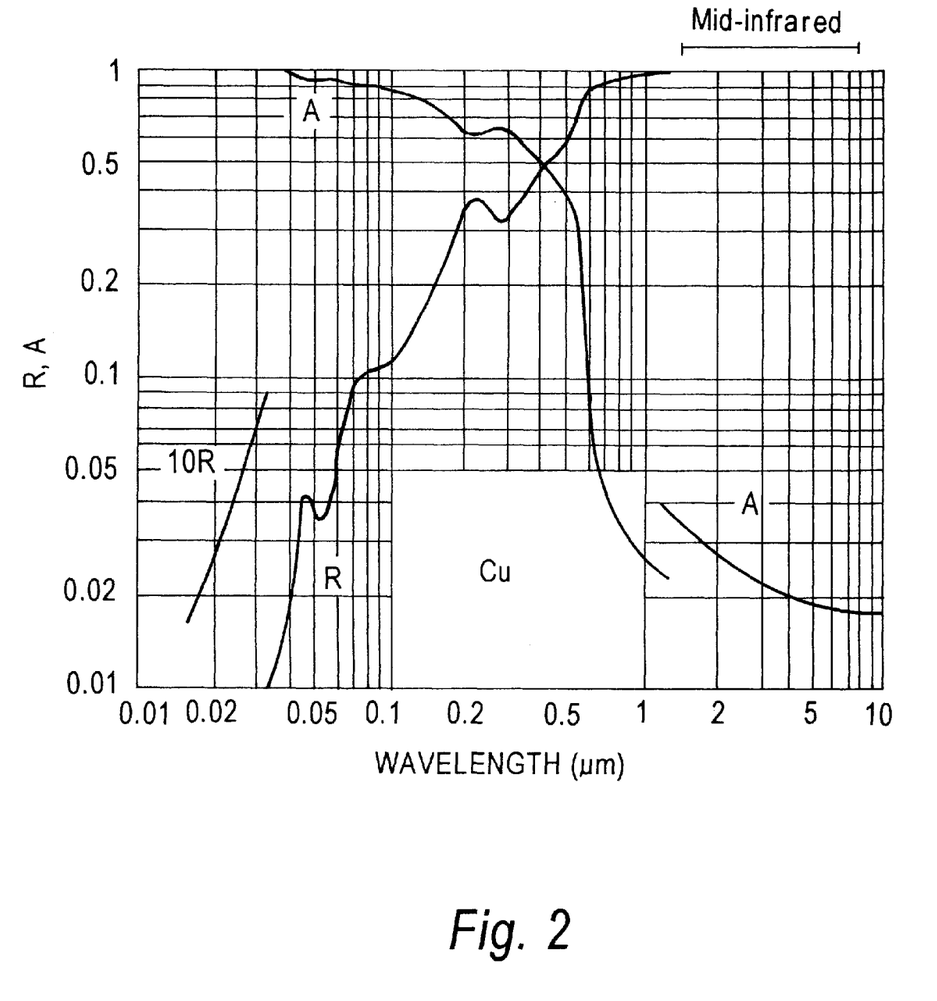
FIG. 2 is a graph presenting reflectivity as a function of wavelength for copper.

Compared to organic materials, the reflectance and absorptive characteristics of most metals are relatively insensitive to wavelength from the visible through to the far-infrared spectral regions. For example as shown in FIG. 2 for copper, the most common metallic conductor material used in the construction of PCB's, the reflectivity R is >90% between $\lambda=0.6$–10 μm while between $\lambda=0.25$–10 μm the photon absorption depth ($\alpha^{-1}$) of is between 12–16 nm. However pulsed $CO_2$ lasers emitting radiation at far-infrared wavelengths between 9–11 μm can drill copper only at impractically high incident single pulse laser fluencies of >>100J/cm$^2$ unless the copper is first provided with an absorptive coating. This ineffectiveness is likely caused by the plasma above the ablation site formed in the earlier phase of the laser pulse screening the laser radiation incident on the surface later in the pulse. Electrons in the plasma can absorb laser light in a process called 'inverse bremsstrahlung absorption' with a strength scaling as the inverse of the wavelength squared. At wavelengths shorter than ~3 μm this absorption becomes negligible, so most of the energy in the laser pulse reaches the surface of the substrate and is used for effective ablative removal of material.

For cleanly drilling conductive metal layers such as copper in electrical circuit interconnection packages, two key criteria must be met by the laser radiation source chosen to match the material being ablated:

(i) the laser radiation wavelength ($\lambda$) should be sufficiently short to avoid plasma screening effects. Typically $\lambda$ should be chosen to be <3 μm.

(ii) the duration t of the laser radiation pulse should be sufficiently short to minimize the 'heat affected zone' (HAZ) in the thermally conducting metal. The size of the HAZ predicted theoretically is $2\sqrt{\chi\tau}$, where $\chi$ is the thermal diffusivity of the material. For metals which have large values of $\chi$, $\tau$ should be chosen to be typically <1 μsec.

In the manufacture of PCB's only the Nd laser, at its fundamental and harmonic wavelengths of 1.06 μm, 533 nm, 355 nm and 266 nm, has been used successfully to laser drill microvia holes through the top metallic conductor layer.

The higher average powers and lower operating costs of mid-infrared lasers coupled to higher material ablation rates (>1 μm/pulse), make them well suited for drilling the top metal layer of printed circuit boards. Wavelengths generated by some mid-infrared lasers remain sufficiently short to avoid the plasma screen effects which become prohibitive when attempting to drill metals like copper with longer wavelength far-infrared radiation.

The method may comprise drilling microvia holes in a copper layer of a printed circuit board, using a pulsed laser radiation source emitting radiation having a wavelength or wavelengths between 1.5–5 μm.

The pulsed laser radiation source may comprise a Ho laser, or an Er laser, or a laser and an OPO or an OPA. The pulsed laser radiation source preferably has an irradiation fluence of greater than 10J/cm$^2$. At such fluencies, radiation of these wavelengths can be effective in drilling metallic copper without incurring the deleterious effect of plasma screening which makes drilling metals such as copper at longer wavelengths ineffective.

The material comprising the dielectric insulating layer of electrical circuit interconnection packages usually consists of a polymer-based material such as resins, epoxies, phenolics, polyimides and polytetrafluoroethylene sometimes containing embedded fibers of aramid, glass, silica or carbon which provide added reinforcing strength. It is well known that pulsed laser ablation of organic polymer-based materials can produce microfeatures in the 1–100 μm size range with almost negligible heat degradation effects (charring, melting, burning, etc) induced to the surrounding material. If such clean removal and lack of collateral damage in this process of 'cold ablation', are to be achieved, two key criteria must be met by the laser radiation source chosen to match the material being ablated:

(i) the laser radiation should be strongly absorbed at the surface of the material. The wavelength ($\lambda$) thereof should be chosen such that photon penetration depths ($\alpha^{-1}$) in the dielectric material are typically <10 μm.

(ii) the duration of the laser radiation pulse should be short to minimize the HAZ in the thermally insulating dielectric material. For thermal insulators which have small values of $\chi$, $\tau$ should be chosen to be typically <100 μsec.

For drilling microvias in the dielectric layer of PCB's, until now criteria (i) has been satisfied by using either short-pulsed $CO_2$ lasers tuned to a vibrational absorption band in the dielectric medium—usually at a wavelength near 9.3 μm, or ultraviolet frequency-converted 3rd and 4th-harmonic Nd lasers at 355 nm or 266 nm wavelengths. At far-infrared wavelengths near 10 μm, vibrational excitation of constituent carbon based molecular bonds allows appropriately wavelength-tuned pulsed $CO_2$ lasers to satisfy criteria (i) for cold ablation. Also criteria (i) is well satisfied at ultraviolet wavelengths since most polymer materials absorb light strongly in this spectral region—for wavelengths shorter than ~350 nm, values of $\alpha^{-1}$<<1 μm are achieved in most materials due to strong excitations of electronic transitions and dissociative processes of composite molecules. Transversely-excited at atmospheric pressure (TEA) or rf-excited types of $CO_2$ lasers or Q-switched Nd lasers are used to provide the short pulse duration requirement of criteria (ii). In the visible and near-infrared spectral regions between 400 nm–1.5 μm many polymer materials are transmissive and generally have insufficient absorption to initiate effective cold ablative processes. On the other hand, most polymer materials exhibit rich vibrational absorption spectra in the mid-infrared spectral region.

In the manufacture of PCB's only the $CO_2$ laser and the Nd laser at its harmonic wavelengths of 355 nm and 266 nm have been used successfully to laser drill blind microvia holes through the insulating dielectric layer.

The method may comprise drilling microvia holes in a dielectric layer of a printed circuit board, using a pulsed laser radiation source emitting radiation having a wavelength or wavelengths between 1.5–8 μm.

The pulsed laser radiation source may comprise a Ho laser, or an Er laser, or a CO laser, or a laser and an OPO or an OPA.

The dielectric layer may comprise a polymer based material such as a resin, epoxy, phenolic, polyimide or polytetrafluoethylene, and the wavelength or wavelengths of the pulsed laser radiation from the source is preferably chosen to match a strong absorption or absorptions in the material. For example, CO lasers emit radiation having wavelengths which match strong absorptions in many polymer materials corresponding to C—O, C—H and C—N bond excitations. Er lasers emit radiation having a wavelength which matches a strong absorption in a resin material commonly used as the dielectric layer in PCB's.

Figure 3:
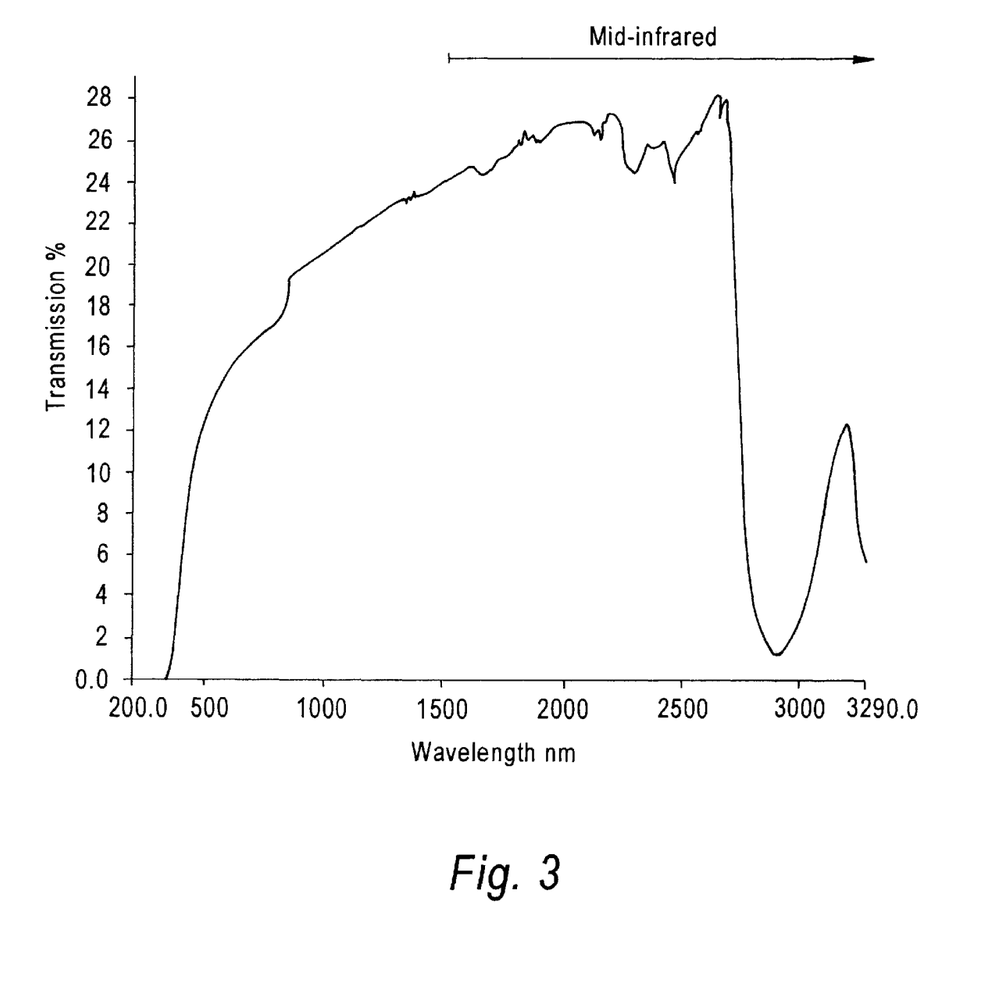
FIG. 3 shows an absorption spectrum of a resin material commonly used as the dielectric layer in printed circuit boards.

FIG. 3 shows the measured absorption spectrum for this material. It can be seen similar absorptances occur at both mid-infrared and ultraviolet wavelengths of 2.9 μm and 370 nm, and criteria (i) above would be satisfied by choosing for microvia drilling a pulsed laser source producing radiation at 2.9 μm. Suitable sources would be the Er laser, or an appropriately wavelength tuned OPO or OPA producing radiation at 2.94 μm.

The dielectric layer may also comprise fibres or dispersed particles of materials such as aramid, glass, silica, ceramics or carbon which provide added reinforcing strength, and the wavelength or wavelengths of the pulsed laser radiation from the source is preferably chosen to match a strong absorption or absorptions in these materials.

Figure 4A:
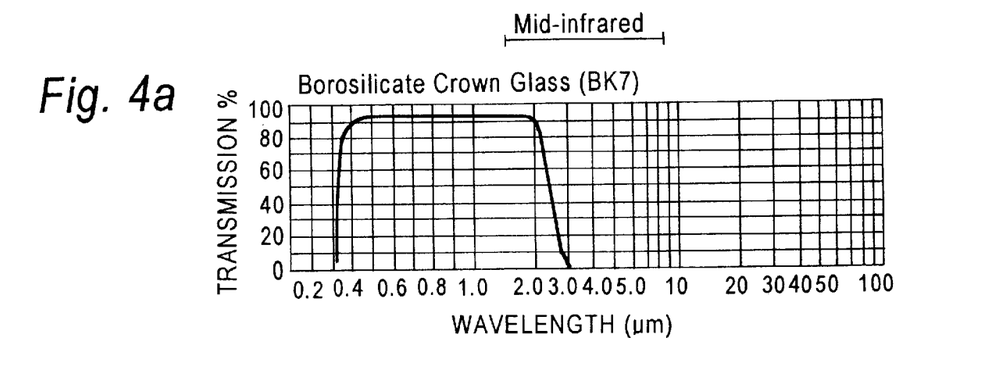
FIGS. 4a–4c show absorption spectrums of various reinforcing materials used to reinforce the dielectric layer in printed circuit boards.
Figure 4B:
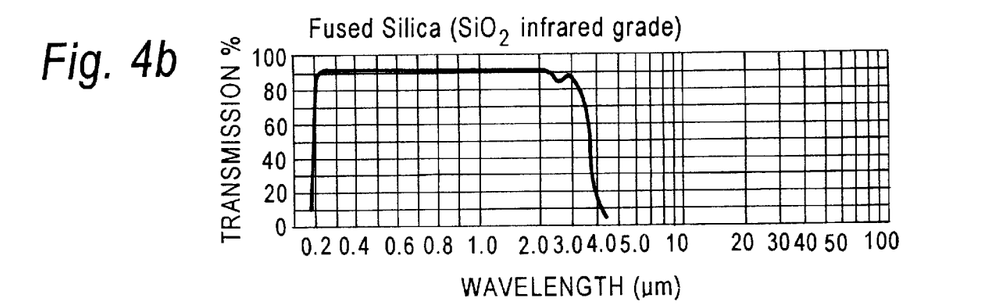
Figure 4C:
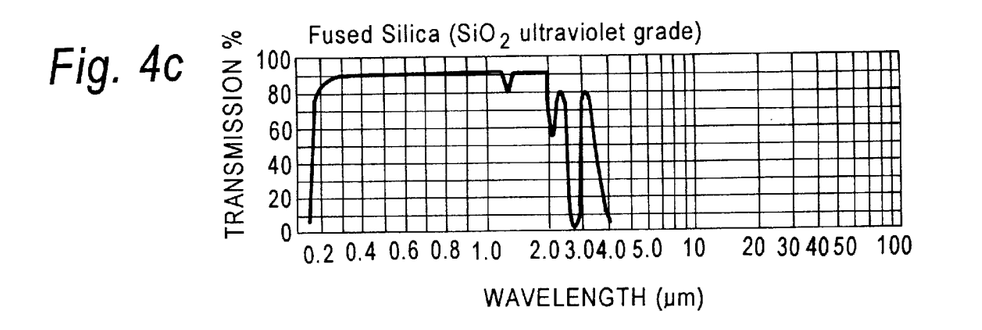

Such reinforcing materials are highly absorbing to mid-infrared radiation—see for example FIG. 4 for the absorption spectrum of glass and silica materials, laser radiation sources emitting radiation having a wavelength or wavelengths in the mid-infrared region can be effective in cutting cleanly any fibres or dispersed particles used to reinforce the dielectric material.

The dielectric layer may also comprise water content in the dielectric material having hydroxyl O—H bonds, and the pulsed laser radiation source is preferably an Er laser emitting radiation having a wavelength of 2.94 μm which overlaps the strong excitation of the O—H bonds. Absorption at this wavelength in organic dielectric materials can be as high as at ultraviolet wavelengths.

The microvia holes drilled in the dielectric layer using mid-infrared sources are high-quality, clean microvia holes, and can be drilled at high speeds.

Because interconnection packages like that shown in FIG. 1 comprise a lamination of several layers of metal conductor-polymer insulator, when drilling one layer due care and attention must be given to not adversely affect the electromechanical properties of others. For example, it is known that when using a pulsed laser for drilling the top copper layer at wavelengths transmitted by the dielectric below, catastrophic stress-induced cracks and delamination can be produced in some material combinations. Such stress is likely created by laser light passing through the dielectric material being reflected from the copper below. After assembly such flaws can lead to circuit shorts. The problem can be circumvented using a wavelength for drilling the copper layer which is also absorbed strongly in the dielectric material below. This restricts further the wavelengths which can be used for drilling the copper layer. For some material combinations, the successful manufacture of PCB's which incorporate laser microvia drilled copper layers without any damage induced to the dielectric layer below has only been achieved using lasers which produce ultraviolet radiation. The wavelength or wavelengths of the radiation of the pulsed laser radiation from the source is preferably chosen such that the radiation drills microvia holes in a top copper layer of a printed circuit board without inducing collateral damage to surrounding underlying dielectric insulating material. For example, the pulsed laser radiation source may be an Er laser emitting radiation having a wavelength of 2.94 μm. This can be used to drill the copper layer of printed circuit boards without inducing damage to the underlying dielectric layer.

Drilling the intermediate layer of most dielectric materials with $CO_2$ laser radiation allows blind microvia holes to be drilled without risking damage to the lower copper layer. Drilling stops automatically (self-limits) at the copper level below. In contrast, to avoid such damage occurring to the underlying copper layer below when drilling the dielectric material with UV or near-ir lasers, the irradiation fluence and dose (number of pulses) of the radiation passing down the hole must be tightly controlled. The degree of control necessary to reduce close to zero the risk of damage is difficult to achieve and slows down the maximum drilling speed which can be achieved by UV or near-ir laser-based drilling machines.

The method may further comprise drilling blind microvia holes in a dielectric layer of a printed circuit board using a pulsed laser radiation source emitting radiation having a wavelength or wavelengths in the mid-infrared spectral region, the drilling self-limiting at a copper layer beneath the dielectric layer.

This is preferably achieved with only a small dynamic adjustment to the drilling fluence.

The adjustment to the drilling fluence preferably does not substantially reduce the maximum drilling speed.

The laser radiation source is preferably chosen such that its wavelength or wavelengths match an absorptive feature of the material of the dielectric layer.

When drilling blind microvia holes with radiation from a far-infrared $CO_2$ laser the hole in the dielectric material often exhibits an undercut with a negative non-linear taper in the shape of a teacup or bell. Such shapes can sometimes cause difficulties in subsequent electroplating steps and in such cases are undesirable. 'Belling' appears to be caused by radiation which passes through the dielectric material being reflected from the bottom copper material. The backtravelling radiation then induces ablative removal of material in undercut regions.

Compared to the 9–11 μm wavelength region, the higher absorptions of polymer materials at mid-infrared wavelengths, such as at 2.9 μm and between 5–6 μm, make undercut holes less likely to be produced when drilling the dielectric material with pulsed laser sources in this wavelength region.

According to a second aspect of the present invention, there is provided a method of drilling microvia holes in printed circuit boards or printed wiring boards or other electrical circuit interconnections packages using a laser drilling tool incorporating a pulsed laser radiation source emitting radiation in the mid-infrared wavelength region.

According to a third aspect of the present invention there is provided a laser drilling tool for drilling microvia holes in printed circuit boards incorporating a pulsed radiation laser source emitting radiation in the 1.5–8 μm mid-infrared wavelength range. The laser drilling tool is designed to drill microvia holes at high speed and low unit cost.

The pulsed laser radiation source may comprise a Ho laser. The pulsed laser radiation source may comprise a CW pumped (by flashlamp or diode laser) Q-switched Er laser, producing pulses of radiation at 2.94 μm wavelength of <200 nsec duration at repetition frequencies exceeding 2 kHz.

Ho and Er lasers may be optically pumped. Pulsed Ho and Er lasers produce light at wavelengths of 2.1 μm and 2.94 μm respectively. By the use of techniques such as pulsed excitation, Q-switching and modelocking, these lasers may be configured to produce pulses of radiation lasting between milliseconds to picoseconds. Radiation at the Er laser wavelength of 2.94 μm overlaps the strong excitation of hydroxyl O—H bonds, which might exist in a sample for example due to any water content in the material. Ho and Er lasers may use optical excitation in the form of flashlamp diode laser pumping. These lasers are relatively inexpensive laser technology, and have low operating costs.

The pulsed laser radiation source may comprise a laser and an optical parametric oscillator (OPO) or an optical parametric amplifier (OPA). OPO's and OPA's are devices which convert one laser radiation wavelength into other longer wavelengths. A non-linear optical medium, usually a crystal, converts a high energy photon from a pump laser into two lower energy photons (the signal and idler). Because the exact wavelength of the signal and idler depend on the angle of the crystal to the pump beam, the wavelengths generated can be made tuneable by rotating the crystal. The crystal can be used in the form of a simple amplifier (OPA's) or contained in its own resonant optical cavity providing feedback oscillations of the generated wavelengths (OPO's). Using Q-switched Nd laser pump sources at 1.06 µm wavelength, OPO's and OPA's can generate with high efficiency tuneable radiation in the 1.5–4.8 µm spectral region. Average powers of >5W can be achieved in pulse duration's of <200 nsec.

The pulsed laser radiation source may comprise a carbon monoxide (CO) laser. CO lasers are a class of gas lasers which are pumped by electrical discharges. CO lasers produce radiation at a range of wavelengths between 5–6 µm. By the use of techniques such as pulsed excitation, Q-switching and modelocking, these lasers may be configured to produce pulses of radiation lasting between milliseconds to picoseconds. Radiation at CO laser wavelengths overlaps strong C—O, C—H and C—N bond excitations in most polymer materials. CO lasers may use discharge excitation in forms of radio frequency (rf), longitudinal low pressure or transversely excited (TE).

The laser drilling tool may incorporate a system architecture such as computer-controlled galvanometer mirrors, which position a focused laser radiation beam from the pulsed laser radiation source on the surface of the PCB with high speed and accuracy.

Alternatively, the PCB may be moved on motorised tables underneath a focused laser radiation beam from the pulsed laser radiation source.

The pulsed laser radiation source may be used for drilling blind and through microvia holes in dielectric layers of PCBs. The dielectric layers may consist of materials such as epoxies, phenolics, polyimides, polytetrafluoethylene, FR-4. The pulsed laser radiation source may additionally or alternatively be used for drilling blind and through microvia holes in top conductive layers of PCB's.

The laser drilling tool may be used to drill holes in a percussion mode whereby the focal spot size determines the diameter of the hole to be drilled. Alternatively, the laser drilling tool may be used to drill holes in a trepanning mode whereby the focal spot is made smaller than the hole to be drilled and is then moved in a circular, elliptical or spiral motion defining the hole diameter.

The laser drilling tool preferably drills microvia holes of less than 100 µm diameter at rates in excess of 200 holes/sec. This depends of the thickness of the materials of the PCB, the hole size and densities.

An embodiment of the third aspect of the invention will now be described by way of example only.

The laser drilling tool incorporates a high power pulsed laser radiation source, comprising a CW pumped, Q-switched Er laser. This produces a focused laser radiation beam of pulses of radiation at 2.94 µm wavelength of less than 200 ns duration at repetition frequencies exceeding 1 kHz. The laser radiation beam is focused on the surface of the PCB, and used to drill blind and through microvia holes in the dielectric and/or top conductive layers of the PCB. The holes are drilled using a percussion mode or a trepanning mode. The tool can drill microvia holes of less than 100 µm diameter at rates in excess of 200 holes/sec.

What is claimed is:

1. A method of drilling a microvia hole in an electrical circuit interconnection package which is a laminate of at least one metal layer and at least one dielectric layer, said method comprising the steps of:

providing a pulsed laser radiation source emitting radiation having a wavelength in the mid-infrared range, wherein said wavelength is longer than 3 µm and shorter than 8 µm; and focusing said radiation on the electrical circuit interconnection package at a location where the microvia hole is to be formed.

2. A method according to claim 1, wherein said pulsed laser radiation source comprises a Holmium laser, producing radiation at 2.1 µm wavelength.

3. A method according to claim 1, wherein said pulsed laser radiation source comprises an Erbium laser, producing radiation at 2.9 µm wavelength.

4. A method according to claim 1, wherein said pulsed laser radiation source comprises a gas carbon monoxide laser, producing said radiation having said wavelength in a range from about 5 to about 6 µm.

5. A method according to claim 1, wherein said pulsed laser radiation source comprises a laser and an optical parametric oscillator, tunable between about 3 and about 4.8 µm, and the providing step comprises:

emitting, by said laser, initial radiation having an initial wavelength shorter than said wavelength; and converting, by said optical parametric oscillator, the initial radiation having said initial wavelength into said radiation having said wavelength.

6. A method according to claim 1, wherein said pulsed laser radiation source comprises a laser and an optical parametric amplifier, tunable between about 3 and about 4.8 µm, and the providing step comprises:

emitting, by said laser, initial radiation having an initial wavelength shorter than said wavelength; and converting, by said optical parametric amplifier, the initial radiation having said initial wavelength into said radiation having said wavelength.

7. A method according to claim 1, wherein the pulsed laser radiation source produces an average laser radiation power of greater than 2 watts.

8. A method according to claim 1, wherein said at least one metal layer comprises a copper layer being drilled by said radiation having said wavelength which is in a range of from above 3 µm to about 5 µm.

9. A method according to claim 8, wherein the pulsed laser radiation source comprises a Holmium laser.

10. A method according to claim 8, wherein the pulsed laser radiation source comprises an Erbium laser.

11. A method according to claim 8, wherein the pulsed laser radiation source comprises a laser and an optical parametric oscillator, and the providing step comprises:

emitting, by said laser, initial radiation having an initial wavelength shorter than said wavelength; and converting, by said optical parametric oscillator, the initial radiation having said initial wavelength into said radiation having said wavelength.

12. A method according to claim 8, wherein the pulsed laser radiation source comprises a laser and an optical parametric amplifier, and the providing step comprises:

emitting, by said laser, initial radiation having an initial wavelength shorter than said wavelength; and converting, by said optical parametric amplifier, the initial radiation having said initial wavelength into said radiation having said wavelength.

13. A method according to claim 8, wherein the pulsed laser radiation source has an irradiation fluence of greater than 10 J/cm$^2$.

14. A method according to claim 1, wherein said at least one dielectric layer is drilled by said radiation having said wavelength which is in a range of from above 3 μm to below 8 μm.

15. A method according to claim 14, wherein the pulsed laser radiation source comprises a Holmium laser.

16. A method according to claim 14, wherein the pulsed laser radiation source comprises an Erbium laser.

17. A method according to claim 14, wherein the pulsed laser radiation source comprises a carbon monoxide laser.

18. A method according to claim 14, wherein the pulsed laser radiation source comprises a laser and an optical parametric oscillator, and the providing step comprises:
   emitting, by said laser, initial radiation having an initial wavelength shorter than said wavelength; and
   converting, by said optical parametric oscillator, the initial radiation having said initial wavelength into said radiation having said wavelength.

19. A method according to claim 14, wherein the pulsed laser radiation source comprises a laser and an optical parametric amplifier, and the providing step comprises:
   emitting, by said laser, initial radiation having an initial wavelength shorter than said wavelength; and
   converting, by said optical parametric amplifier, the initial radiation having said initial wavelength into said radiation having said wavelength.

20. A method according to claim 14, wherein the dielectric layer comprises a polymer based material, and the wavelength of the radiation is chosen to match a strong absorption or absorptions in the material.

21. A method according to claim 20, wherein the pulsed laser radiation source comprises a carbon monoxide laser which emits said radiation having said wavelength which matches strong absorptions in said polymer based material corresponding to carbon-oxygen, carbon-hydrogen and carbon-nitrogen bond excitations.

22. A method according to claim 20, wherein the pulsed laser radiation source comprises an Erbium laser which emits laser radiation having a laser wavelength which matches a strong absorption in a resin material used as the dielectric layer.

23. A method according to claim 20, wherein the dielectric layer comprises fibres or dispersed particles of reinforcing materials, and the wavelength of the pulsed laser radiation from the source is chosen to match a strong absorption or absorptions in the reinforcing material.

24. A method according to claim 20, wherein the dielectric layer comprises a dielectric material having a water content, and the pulsed laser radiation source comprises an Erbium laser emitting laser radiation having a laser wavelength of about 2.9 μm which overlaps the strong excitation of hydroxyl bonds in the water.

25. A method according to claim 14, wherein the wavelength of the radiation is chosen such that the radiation drills the microvia hole in the metal layer, which is a copper layer, without inducing collateral damage to the dielectric layer made of insulating material and underlying the copper layer.

26. A method according to claim 25, wherein the pulsed laser radiation source comprises an Erbium laser emitting laser radiation having a laser wavelength of 2.94 μm.

27. A method according to claim 1, wherein the microvia hole is a blind microvia hole drilled in the dielectric layer and having a bottom defined by the metal layer which is a copper layer, the pulsed laser radiation source emitting said radiation having said wavelength in the mid-infrared spectral region, wherein said radiation is sufficiently strong to remove said dielectric layer but incapable of removing the copper layer thereby the drilling of said blind microvia hole self-limiting at the copper layer beneath the dielectric layer.

28. A method according to claim 27, wherein the wavelength matches an absorptive feature of the material of the dielectric layer.

29. A laser drilling tool for drilling a microvia hole in a printed circuit board which is a laminate of at least one conductive layer and at least one dielectric layer, said tool comprises a pulsed laser radiation source emitting radiation in the infrared wavelength range, wherein said wavelength is longer than 3 μm and shorter than 8 μm.

30. A laser drilling tool according to claim 29, wherein the pulsed laser radiation source comprises a Holmium laser.

31. A laser drilling tool according to claim 29, wherein the pulsed laser radiation source comprises an Erbium laser.

32. A laser drilling tool according to claim 29, wherein the pulsed laser radiation source comprises
   a laser for emitting an initial radiation having an initial wavelength shorter than said wavelength; and
   an optical parametric oscillator coupled for receiving said initial radiation and for converting the initial radiation having said initial wavelength into said radiation having said wavelength.

33. A laser drilling tool according to claim 29, wherein the pulsed laser radiation source comprises
   a laser for emitting an initial radiation having an initial wavelength shorter than said wavelength; and
   an optical parametric amplifier coupled for receiving said initial radiation and for converting the initial radiation having said initial wavelength into said radiation having said wavelength.

34. A laser drilling tool according to claim 29, wherein the pulsed laser radiation source comprises a carbon monoxide laser.

35. A laser drilling tool according to claim 29, further comprising a system architecture which focuses the radiation on the printed circuit board at a location where the microvia hole is to be drilled.

36. A laser drilling tool according to claim 35, further comprising a motorized table for supporting the printed circuit board and moving the printed circuit board relative to and underneath the focused radiation.

37. A laser drilling tool according to claim 29, wherein the microvia hole comprises blind and through microvia holes drilled in the dielectric layer of the printed circuit board.

38. A laser drilling tool according to claim 29, wherein the microvia hole comprises blind and through microvia holes drilled in the conductive layer which is laminated on top the dielectric layer.

39. A laser drilling tool according to claim 29, wherein the tool drills holes in a percussion mode.

40. A laser drilling tool according to claim 29, wherein the tool drills holes in a trepanning mode.

41. A laser drilling tool according to claim 29, wherein the microvia hole is less than 100 μm in diameter.

42. A method of drilling a microvia hole in a printed circuit board having a copper layer laminated on top a dielectric layer, said method comprising the steps of:
   emitting laser radiation from a pulsed laser radiation source, said laser radiation having a wavelength of from about 1.5 μm to about 5 μm; and
   focusing said radiation on the copper layer of the printed circuit board at a location where the microvia hole is to be drilled;
   wherein the pulsed laser radiation source has an irradiation fluence of greater than 10 J/cm$^2$.

43. The method of claim 42, wherein said laser radiation is emitted from a Holmium laser and said wavelength is about 2.1 µm.

44. The method of claim 42, wherein said laser radiation is emitted from a Erbium laser and said wavelength is about 2.9 µm.

45. The method of claim 42, wherein said wavelength is chosen to match a strong absorption in a material of the dielectric layer so that the radiation is absorbed strongly by the underlying dielectric layer.

46. The method of claim 45, wherein the dielectric layer is made of a resin, and said wavelength is about 2.9 µm which matches a strong absorption in the resin.

47. The method of claim 46, wherein said laser radiation is emitted from a Erbium laser which has said wavelength of about 2.9 µm.

48. The method of claim 46, wherein said emitting step comprises emitting, by a laser, initial radiation having an initial wavelength shorter than said wavelength; and converting, by at least one of an optical parametric oscillator and an optical parametric amplifier, the initial radiation having said initial wavelength into said radiation having said wavelength, said at least one of an optical parametric oscillator and an optical parametric amplifier is tuned at about 2.9 µm.

49. The method of claim 45, wherein the dielectric layer is made of an insulating material having a water content, and said wavelength is about 2.9 µm which overlaps the strong excitation of hydroxyl bonds in the water.

50. The method of claim 42, wherein the printed circuit board further has another copper layer laminated to and underlying the dielectric layer, said method further comprising the steps of:

adjusting the fluence of the radiation after the copper layer has been drilled through, said adjusted fluence being sufficient to remove a material of the dielectric layer but insufficient to remove copper; and drilling the dielectric layer underlying the copper layer with the adjusted radiation, said drilling self-limiting at said another copper layer beneath the dielectric layer.

51. The method of claim 50, wherein said adjusting is conducted without changing the wavelength of said radiation.

52. The method of claim 51, wherein said laser radiation is emitted from a Erbium laser and said wavelength is about 2.9 µm.

* * * * *